United States Patent
Bhatia

(10) Patent No.: US 12,142,344 B2
(45) Date of Patent: Nov. 12, 2024

(54) TECHNIQUES FOR REDUCING DRAM POWER USAGE IN PERFORMING READ AND WRITE OPERATIONS

(71) Applicant: NVIDIA CORPORATION, Santa Clara, CA (US)

(72) Inventor: Gautam Bhatia, Mountain View, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 149 days.

(21) Appl. No.: 17/959,586

(22) Filed: Oct. 4, 2022

(65) Prior Publication Data

US 2023/0124767 A1 Apr. 20, 2023

Related U.S. Application Data

(60) Provisional application No. 63/257,522, filed on Oct. 19, 2021.

(51) Int. Cl.
*G11C 7/10* (2006.01)
*G11C 7/22* (2006.01)

(52) U.S. Cl.
CPC .......... *G11C 7/1096* (2013.01); *G11C 7/1069* (2013.01); *G11C 7/222* (2013.01)

(58) Field of Classification Search
CPC ...... G11C 7/1096; G11C 7/1069; G11C 7/222
USPC .................................................. 365/189.011
See application file for complete search history.

(56) References Cited

U.S. PATENT DOCUMENTS

| | | | |
|---|---|---|---|
| 2005/0180255 A1 | 8/2005 | Tsern et al. | |
| 2014/0351542 A1 | 11/2014 | Deb | |
| 2015/0085566 A1* | 3/2015 | Jain | G11C 8/08 365/230.03 |
| 2017/0372775 A1* | 12/2017 | Walker | G11C 11/412 |
| 2023/0048973 A1* | 2/2023 | Lee | G11C 7/1057 |

OTHER PUBLICATIONS

International Search Report for Application No. PCT/US2022/078076 dated Jan. 26, 2023.

* cited by examiner

*Primary Examiner* — Ly D Pham
(74) *Attorney, Agent, or Firm* — Squire Patton Boggs LLP; Sarah Mirza

(57) ABSTRACT

Various embodiments include a memory device that is capable of performing memory access operations with reduced power consumption relative to prior approaches. The memory device receives early indication as to whether a forthcoming memory access operation is a read operation or a write operation. The memory device enables various circuits and disables other circuits depending on whether this early indication identifies an upcoming memory access operation as a read operation or a write operation. As a result, circuits that are not needed for an upcoming memory access operation are disabled earlier during the memory access operation relative to prior approaches. Disabling such circuits earlier during the memory access operation reduces power consumption without reducing memory device performance.

20 Claims, 8 Drawing Sheets

TECHNIQUES FOR REDUCING DRAM POWER USAGE IN PERFORMING READ AND WRITE OPERATIONS

CROSS-REFERENCE TO RELATED APPLICATIONS

This application claims priority benefit of the United States Provisional Patent Application titled, "TECHNIQUES FOR REDUCING DRAM POWER USAGE IN PERFORMING READ AND WRITE OPERATIONS," filed on Oct. 19, 2021 and having Ser. No. 63/257,522. The subject matter of this related application is hereby incorporated herein by reference.

BACKGROUND

Field of the Various Embodiments

Various embodiments relate generally to computer memory devices and, more specifically, to techniques for reducing DRAM power usage in performing read and write operations.

Description of the Related Art

A computer system generally includes, among other things, one or more processing units, such as central processing units (CPUs) and/or graphics processing units (GPUs), and one or more memory systems. One type of memory system is referred to as system memory, which is accessible to both the CPU(s) and the GPU(s). Another type of memory system is graphics memory, which is typically accessible only by the GPU(s). These memory systems comprise multiple memory devices. One example memory device employed in system memory and/or graphics memory is synchronous dynamic-random access memory (SDRAM or, more succinctly, DRAM).

Conventional high-speed DRAM devices include several internal clock distribution systems in the form of networks, trees, input/output (IO) circuits, and/or the like. These internal clock distribution systems include, for example: (1) a common clock distribution system and IO circuits; (2) a read clock distribution system and IO circuits; and (3) a write clock distribution system and IO circuits. The common clock distribution system is used to transmit and/or distribute a clock signal to various logic circuits that are common to both read and write operations within the DRAM device. The common IO circuitry can consist of digital circuitry and/or analog circuitry used to support memory read operations and/or memory write operations on the DRAM device physical (PHY) layer and/or IO layer. The read clock distribution system is used to transmit and/or distribute a clock signal to certain logic circuits within the DRAM device for performing a read operation. The read IO circuitry can consist of digital circuitry and/or analog circuitry used to support both read operation on the DRAM PHY or IO The write clock distribution system is used to transmit/distribute a clock signal to certain logic circuits within the DRAM device for performing a write operation. Write IO circuitry can consist of digital circuitry or analog circuitry used to support write operation on the DRAM physical layer and/or IO layer. Examples of IO circuitry include receivers, transmitters, reference voltage ($V_{REF}$) generators, and/or the like.

When a DRAM device is not currently performing a memory access operation, certain circuits can be placed in a power down state and/or gated state in order to reduce power consumption. For example, if the DRAM device is not currently performing a memory read operation, then the read clock distribution system and IO circuits can be placed in a power down state and/or gated state. Similarly, if the DRAM device is not currently performing a memory write operation, then the write clock distribution system and IO circuits can be placed in a power down state and/or gated state. When in a powered down state and/or gated state, each of the clock distribution systems and IO circuits require a certain amount of time (that is, a wakeup time) before memory access operations can be resumed. Depending on the power supply integrity and the power consumed by the clock distribution system and IO circuitry, the wakeup time needed before performing a memory read or write operation can be significant.

For example, one approach to disabling and enabling clock distribution system and IO circuitry is to use the read command and write command transmitted by the memory controller and received by the DRAM device to enable and disable the respective read and write clock distributions and IO circuitry. After the DRAM device receives a read command, the DRAM device begins with a fixed, small period of time referred to as the read latency. In parallel with the read latency, the DRAM device enables the read clock distribution system and IO circuitry. After the expiration of the read latency, and after the read clock distribution system and IO circuitry are enabled, the memory transmits the read data retrieved from the DRAM core to the memory controller. Similarly, after the DRAM device receives a write command, the DRAM device begins with a fixed, small period of time referred to as the write latency. In parallel with the write latency, the DRAM device enables the write clock distribution system and IO circuitry. After the expiration of the write latency, and after the write clock distribution system and IO circuitry are enabled, the memory stores the write data received from the memory controller in the DRAM core.

One problem with this approach is that read latency or write latency is generally much shorter than the time to enable the respective clock distribution system and IO circuitry. In many high-speed DRAM devices, the clock distribution system and IO circuitry consume a significant amount of power, which results in significant power-supply noise when enabling or disabling the clock distribution system and IO circuitry. As a result, enabling or disabling the clock distribution system and IO circuitry can take a significant amount of time to wait for this power supply noise to dissipate. If the read latency or write latency is less than the time to enabling the clock distribution system and IO circuitry, then the read operation or write operation is delayed due to the longer enable time. However, delaying the read operation or write operation results in a longer time to complete the read operation or write operation, leading to reduced performance of high-speed DRAM devices.

As the foregoing illustrates, what is needed in the art are more effective techniques for reducing memory device power consumption during read operations and write operations.

SUMMARY

Various embodiments of the present disclosure set forth a computer-implemented method for performing a memory access operation on a memory device. The method includes, prior to receiving the memory access operation, receiving an indicator that identifies the memory access operation as including at least one of a read operation or a write operation. The method further enabling a first circuit based the indicator. The method further maintaining a disabled state of a second circuit based on the indicator.

Other embodiments include, without limitation, a system that implements one or more aspects of the disclosed techniques, and one or more computer readable media including instructions for performing one or more aspects of the disclosed techniques.

At least one technical advantage of the disclosed techniques relative to the prior art is that, with the disclosed techniques, the clock distribution system and IO circuitry are enabled earlier during a memory access operation. In addition, the memory device receives an early indication of whether the upcoming memory access operation is a read operation or a write operation. If the early indication identifies the upcoming memory access operation as a read operation, then the memory device enables only the read clock distribution system and IO circuitry and leaves the write clock distribution system and IO circuitry in a disabled state. Likewise, if the early indication identifies the upcoming memory access operation as a write operation, then the memory device enables only the write clock distribution system and IO circuitry and leaves the read clock distribution system and IO circuitry in a disabled state. As a result, only the needed clock distribution system and IO circuitry are enabled, thereby reducing power consumption relative to approaches that enable both the read clock distribution system and IO circuitry and the write clock distribution system and IO circuitry. These advantages represent one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

System Overview

Figure 1:
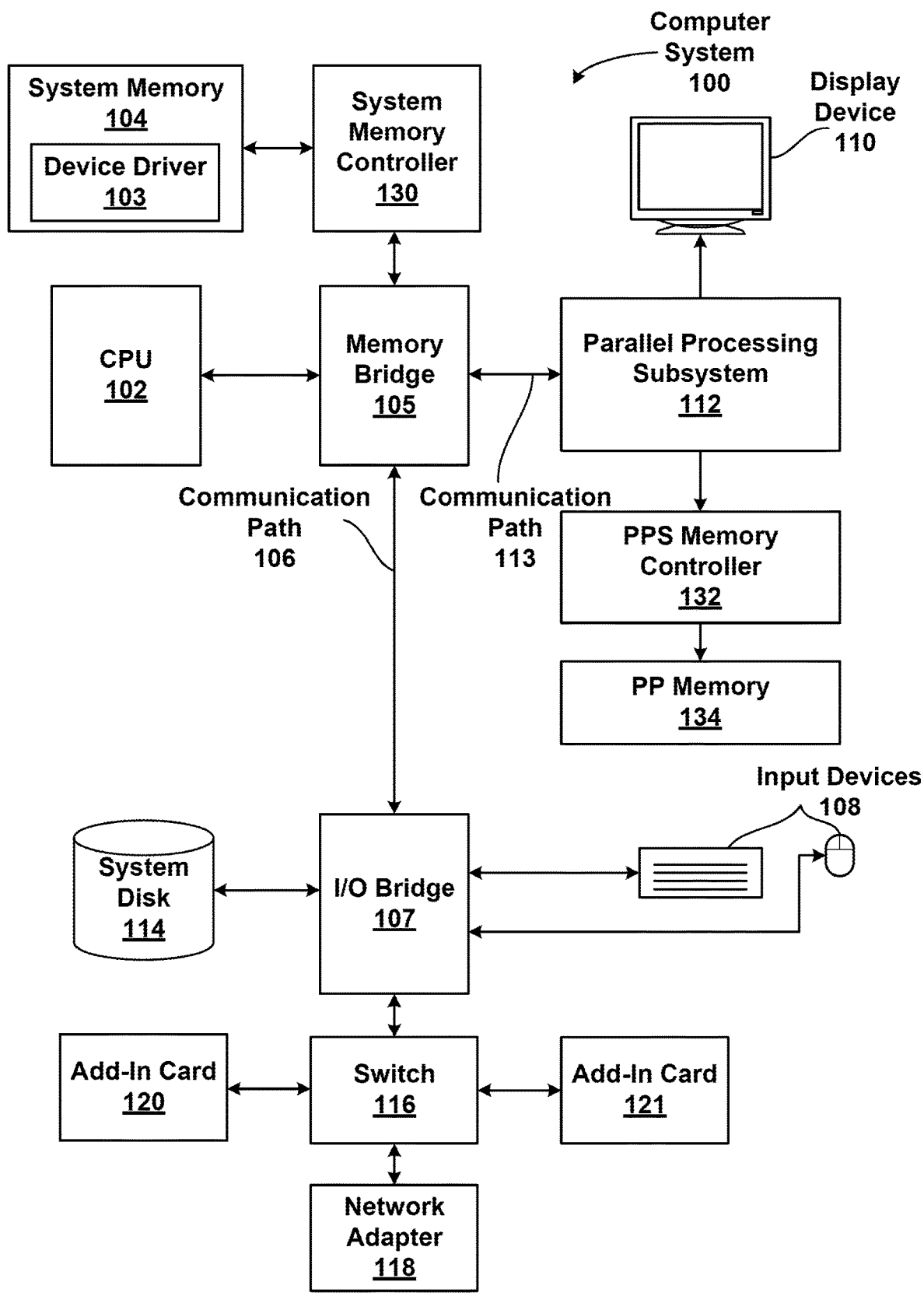
FIG. 1 is a block diagram of a computer system configured to implement one or more aspects of the various embodiments.

FIG. 1 is a block diagram of a computer system 100 configured to implement one or more aspects of the various embodiments. As shown, computer system 100 includes, without limitation, a central processing unit (CPU) 102 and a system memory 104 coupled to a parallel processing subsystem 112 via a memory bridge 105 and a communication path 113. Memory bridge 105 is coupled to system memory 104 via a system memory controller 130. Memory bridge 105 is further coupled to an I/O (input/output) bridge 107 via a communication path 106, and I/O bridge 107 is, in turn, coupled to a switch 116. Parallel processing subsystem 112 is coupled to parallel processing memory 134 via a parallel processing subsystem (PPS) memory controller 132.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high-definition DVD), or other magnetic, optical, or solid-state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, and/or the like. In such embodiments, parallel processing subsystem 112 incorporates circuitry optimized for graphics and video processing, including, for example, video output circuitry. Such circuitry may be incorporated across one or more parallel processing units (PPUs) included within parallel processing subsystem 112. In some embodiments, each PPUS comprises a graphics processing unit (GPU) that may be configured to implement a graphics rendering pipeline to perform various operations related to generating pixel data based on graphics data supplied by CPU 102 and/or system memory 104. Each PPU may be implemented using one or more integrated circuit devices, such as programmable processors, application specific integrated circuits (ASICs), or memory devices, or in any other technically feasible fashion In some embodiments, parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more other elements of FIG. 1 to form a single system. For example, parallel processing subsystem 112 may be integrated with CPU 102 and other connection circuitry on a single chip to form a system on chip (SoC).

In operation, CPU 102 is the master processor of computer system 100, controlling and coordinating operations of other system components. In particular, CPU 102 issues commands that control the operation of PPUs within parallel processing subsystem 112. In some embodiments, CPU 102 writes a stream of commands for PPUs within parallel processing subsystem 112 to a data structure (not explicitly shown in FIG. 1) that may be located in system memory 104, PP memory 134, or another storage location accessible to both CPU 102 and PPUs. A pointer to the data structure is written to a pushbuffer to initiate processing of the stream of commands in the data structure. The PPU reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

Each PPU includes an I/O (input/output) unit that communicates with the rest of computer system 100 via the communication path 113 and memory bridge 105. This I/O unit generates packets (or other signals) for transmission on communication path 113 and also receives all incoming packets (or other signals) from communication path 113, directing the incoming packets to appropriate components of the PPU. The connection of PPUs to the rest of computer system 100 may be varied. In some embodiments, parallel processing subsystem 112, which includes at least one PPU, is implemented as an add-in card that can be inserted into an expansion slot of computer system 100. In other embodiments, the PPUs can be integrated on a single chip with a bus bridge, such as memory bridge 105 or I/O bridge 107. Again, in still other embodiments, some or all of the elements of the PPUs may be included along with CPU 102 in a single integrated circuit or system of chip (SoC).

CPU 102 and PPUs within parallel processing subsystem 112 access system memory 104 via a system memory controller 130. System memory controller 130 transmits signals to the memory devices included in system memory 104 to initiate the memory devices, transmit commands to the memory devices, write data to the memory devices, read data from the memory devices, and/or the like. One example memory device employed in system memory 104 is double-data rate SDRAM (DDR SDRAM or, more succinctly, DDR). DDR memory devices perform memory write and read operations at twice the data rate of previous generation single data rate (SDR) memory devices.

In addition, PPUs and/or other components within parallel processing subsystem 112 access PP memory 134 via a parallel processing subsystem (PPS) memory controller 132. PPS memory controller 132 transmits signals to the memory devices included in PP memory 134 to initiate the memory devices, transmit commands to the memory devices, write data to the memory devices, read data from the memory devices, and/or the like. One example memory device employed in PP memory 134 synchronous graphics random access memory (SCRAM), which is a specialized form of SDRAM for computer graphics applications. One particular type of SCRAM is graphics double-data rate SCRAM (GDDR SDRAM or, more succinctly, GDDR). Compared with DDR memory devices, GDDR memory devices are configured with a wider data bus, in order to transfer more data bits with each memory write and read operation. By employing double data rate technology and a wider data bus, GDDR memory devices are able to achieve the high data transfer rates typically needed by PPUs.

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

It will be appreciated that the core architecture described herein is illustrative and that variations and modifications are possible. Among other things, the computer system 100 of FIG. 1, may include any number of CPUs 102, parallel processing subsystems 112, or memory systems, such as system memory 104 and parallel processing memory 134, within the scope of the disclosed embodiments. Further, as used herein, references to shared memory may include any one or more technically feasible memories, including, without limitation, a local memory shared by one or more PPUs within parallel processing subsystem 112, memory shared between multiple parallel processing subsystems 112, a cache memory, parallel processing memory 134, and/or system memory 104. Please also note, as used herein, references to cache memory may include any one or more technically feasible memories, including, without limitation, an L1 cache, an L1.5 cache, and L2 caches. In view of the foregoing, persons of ordinary skill in the art will appreciate that the architecture described in FIG. 1 in no way limits the scope of the various embodiments of the present disclosure.

Reducing Power Consumption in Performing Read and Write Operations

Various embodiments are directed to techniques for efficiently performing memory access operations in a memory device. With the disclosed techniques, a memory controller includes an indicator, such as a flag or a bit value, with the activate command that identifies whether the upcoming memory access operation is a read operation or a write operation. When the memory controller determines that a memory access operation is in progress, the memory controller transmits a power-down exit command to the memory device. After the expiration of the power-down exit time, the memory controller transmits an activate command to the memory device. The activate command includes a read/write indicator that identifies the memory access command as either a read operation or a write operation.

In response to receiving the activate command, the memory device accesses the read/write indicator. If the read/write indicator identifies the memory access command as a read operation, then the memory device enables only the read clock distribution system and IO circuitry and leaves the write clock distribution system and IO circuitry in a disabled state. After the expiration of the activate time, the read clock distribution system and IO circuitry are now enabled. The memory controller transmits the read command to the memory device. After the read latency expires, the memory device performs the read operation. If the read/write indicator identifies the memory access command as a write operation, then the memory device enables only the write clock distribution system and IO circuitry and leaves the read clock distribution system and IO circuitry in a disabled state. After the expiration of the activate time, the write clock distribution system and IO circuitry are now enabled. The memory controller transmits the write command to the memory device. After the write latency expires, the memory device performs the write operation.

Figure 2:
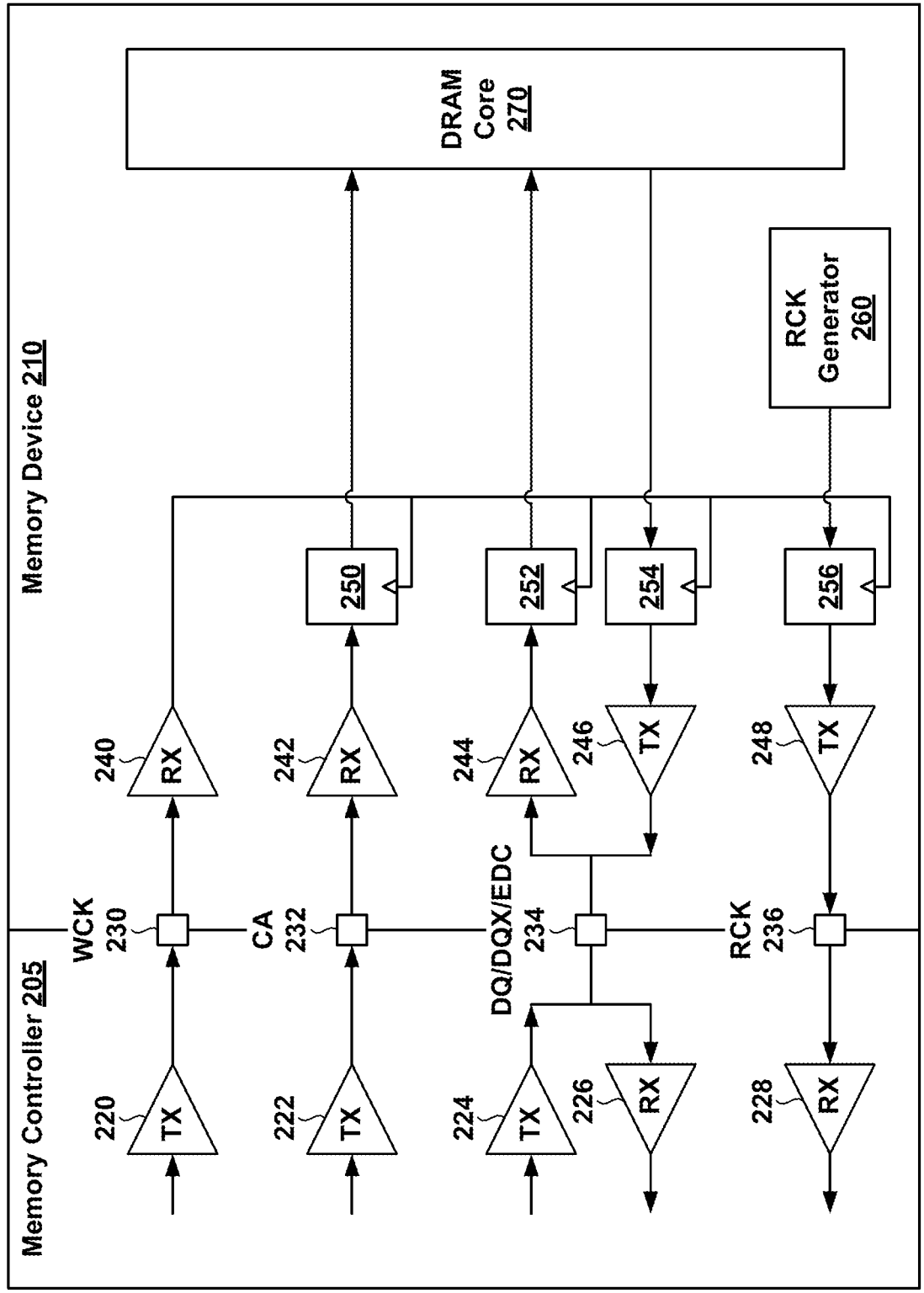
FIG. 2 is a block diagram of the input/output circuit for a memory controller and a memory device included in the computer system of FIG. 1, according to various embodiments.

FIG. 2 is a block diagram of the input/output circuit for a memory controller 205 and a memory device 210 included in the computer system of FIG. 1, according to various embodiments. In some examples, the memory controller 205 is the system memory controller 130 and the memory device 210 is included in the system memory 104. Additionally or alternatively, the memory controller 205 is the PPS memory controller 132 and the memory device 210 is included in the parallel processing memory 134.

As shown, the memory controller 205 transmits a write clock (WCK) signal 230 to the memory device 210 via transmitter (TX) 220. The memory device 210 receives the write clock signal 230 via receiver (RX) 240. The memory device 210 distributes the write clock signal 230 to synchronizing registers 250, 252, 254, and 256 to synchronize various signals exchanged between the memory controller 205 and the memory device 210. The synchronizing registers 250, 252, 254, and 256 capture commands and data being transferred to and from the memory device 210.

In that regard, the memory controller 205 transmits commands to the memory device 210 by transmitting data to command/address (CA) pins 232 via transmitter 222. The memory device 210 receives the data from the command/address pins 232 via receiver 242. The synchronizing register 250 captures the data presented on the command/address pins 232 at clock edges of the write clock signal 230. After synchronization by the synchronizing register 250, the synchronized command/address bits are stored in a DRAM core 270.

Similarly, the memory controller 205 transmits write data to the memory device 210 by transmitting the write data to data (DQ/DQX/EDC) pins 234 via transmitter 224. These data pins 234 include main data (DQ) pins, extended data (DQX) pins, error detection and correction (EDC) pins, and/or the like. The memory device 210 receives the data from the data pins 234 via receiver 244. The synchronizing register 252 captures the data presented on the data pins 234 at clock edges of the write clock signal 230. After synchronization by the synchronizing register 252, the synchronized data bits are stored in the DRAM core 270.

The write clock signal 230 also synchronizes read data transferred from the memory device to the memory controller 205. In that regard, synchronizing register 254 captures main data, extended data, and/or error detection and correction data read from the DRAM core 270 at clock edges of the write clock signal 230. After synchronization by the synchronizing register 254, the synchronized data bits are transmitted via transmitter 246 to the data pins 234. The memory controller 205 receives the main data, extended data, and/or error detection and correction data read from the DRAM core 270 via receiver 226.

During read operations of main data, extended data, and/or error detection and correction data from the DRAM core 270, the memory device 210 can transmit a read clock (RCK) signal 236 that is synchronous with the main data, extended data, and/or error detection and correction data transmitted by the memory device 210. In such cases, synchronizing register 256 synchronizes a read clock signal generated by a read clock (RCK) generator 260 to be synchronous with the write clock signal 230. Transmitter 248 transmits the synchronized read clock signal 236 to the memory controller 205. As a result, the read clock signal 236 is synchronous with the data bits 234 synchronized by synchronizing register 254. The memory controller 205 receives the read clock signal 236 via receiver 228. The memory controller 205 samples the read data received via receiver 226 based on the read clock signal 236 received via receiver 228.

In some examples, the memory controller 205 can configure the memory device 210 to cause the memory device 210 either to utilize or to ignore the read/write indicator. In doing so, the memory controller 205 can transmit a configuration command to the memory device 210, update a register included in the memory device 210, and/or the like.

If the memory controller 205 configures the memory device 210 to ignore read/write indicator, then the memory device 210 enables both the read clock distribution system and the write clock distribution system upon receiving an activate command. Similarly, the memory device 210 enables both the read I/O circuits, the write I/O circuits, and/or other read/write related circuits upon receiving an activate command. This mode may be desirable if the memory controller 205 transmits a single activate command that corresponds to both subsequent read operations and write operations. This mode may be desirable if the memory controller 205 utilizes an activate command to train the data interface of the memory device 210 for both read training commands and write training commands.

In some examples, the memory controller 205 transmits the read/write indicator and/or additional data to the memory device 210 via a command other than an activate command. For example, the memory controller 205 could transmit a power command to the memory device 210 indicating that the memory controller 205 is about to generate memory access operations, including read operations and/or write operations. The power command identifies circuits within the memory device to enable or disable for power consumption management. The power command includes a read/write indicator that indicates whether the memory controller 205 is about to generate a read command or a write command.

If the indicator indicates a read command, then memory device 210 enables the read clock distribution system, read I/O circuitry, and/or other read related circuitry. The memory device 210 maintains the write clock distribution system, write I/O circuitry, and/or other write related circuitry in a disabled state. If the indicator indicates a write command, then the memory device 210 enables the write clock distribution system, write I/O circuitry, and/or other write related circuitry. The memory device 210 maintains the read clock distribution system, read I/O circuitry, and/or other read related circuitry in a disabled state.

In some examples, the memory control 205 transmits a multi-bit code to the memory device 210 in addition to or instead of a single-bit read/write indicator. The multi-bit code indicates whether the memory controller 205 is about to generate: (a) a single read command or a series of read commands; (b) a single write command or a series of write commands; or (c) a combination of one or more read commands and one or more write commands. If the multi-bit code indicates that memory controller 205 is about to generate read commands, then the memory device 210 enables the read clock distribution system, read I/O circuits, and/or other read related circuitry but disables the write clock distribution system, write I/O circuits, and/or other write related circuitry. If the multi-bit code indicates that memory controller 205 is about to generate write commands, then the memory device 210 enables the write clock distribution system, write I/O circuits, and/or other write related circuitry but disables the read clock distribution system, read I/O circuits, and/or other read related circuitry. If the multi-bit code indicates that memory controller 205 is about to generate a combination of read commands and write commands, then the memory device 210 enables both the read clock distribution system and the write clock distribution system. Likewise, the memory device 210 enables both the read and write I/O circuits, and/or other read related circuitry and write related circuitry.

Figure 3A:
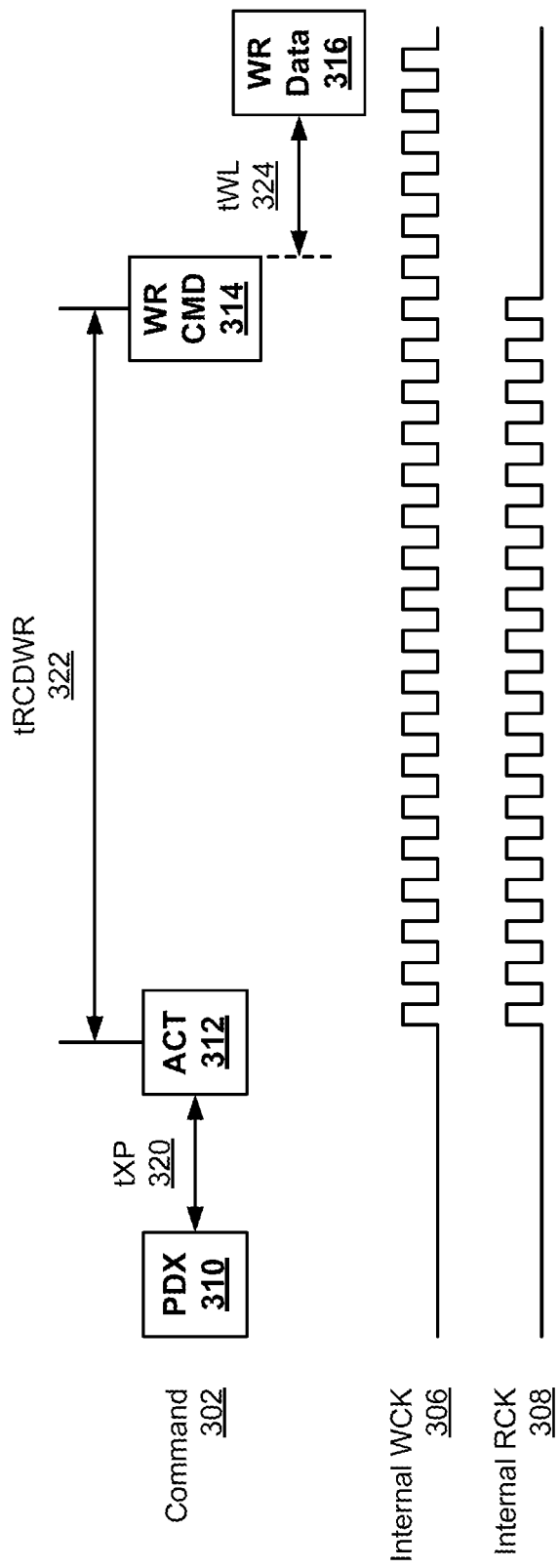
FIGS. 3A-3B set forth timing diagrams illustrating early activation of the clock distribution system and IO circuits during memory access operations of the computer system of FIG. 1, according to various embodiments.
Figure 3B:
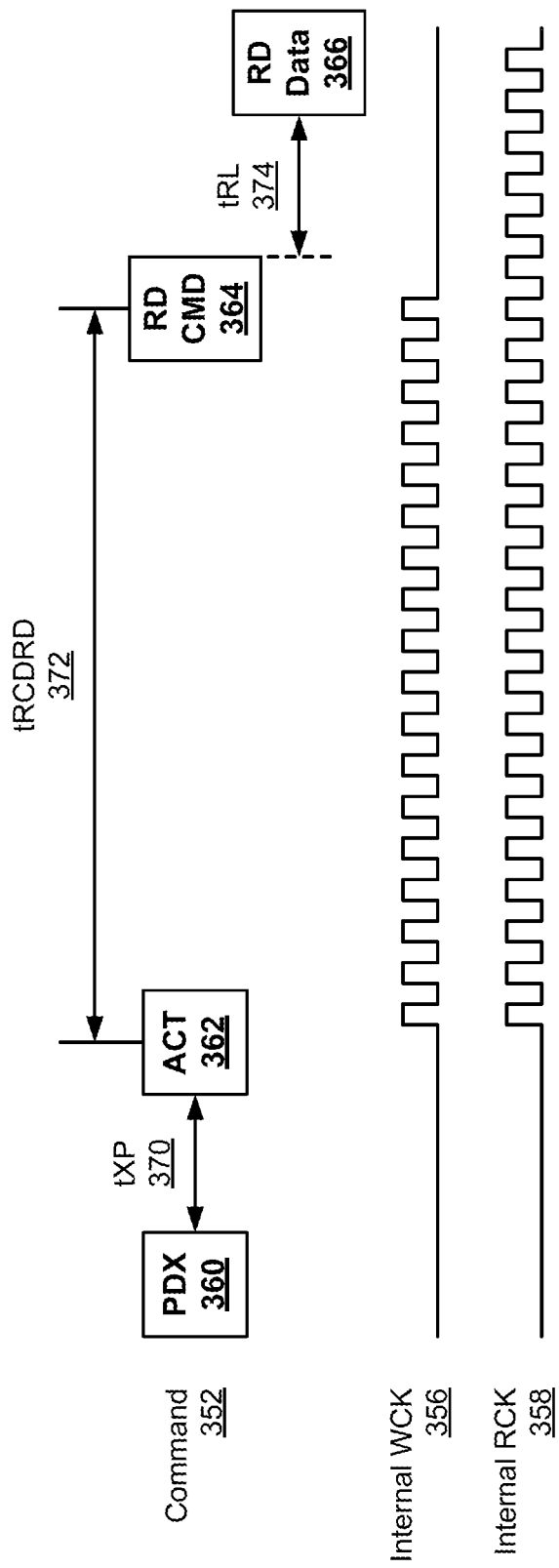

FIGS. 3A-3B set forth timing diagrams illustrating early activation of the clock distribution system and IO circuits during memory access operations of the computer system of FIG. 1, according to various embodiments.

As shown in FIG. 3A, when the memory controller 205 detects that a write memory access operation is in progress, the memory controller 205 issues a command 302 in the form of a power-down exit (PDX) command 310. The memory controller 205 transmits the power-down exit command 310 to the memory device via the command/address pins 232. The memory device 210 receives the power-down exit command 310 and begins the process of exiting the power-down state. The memory controller 205 waits for a period of time, referred to as the power-down exit time (tXP) 320, to ensure that the memory device is now powered up.

After the power-down exit time 320 expires, the memory controller 205 issues a command 302 in the form of an activate (ACT) command 312. The memory controller 205 transmits the activate command 312 to the memory device via the command/address pins 232. The memory device 210 receives the activate command 312 and begins the process of executing the activate command 312. In addition, when the memory device 210 receives the activate command 312, the memory device 210 enables the write clock distribution system and IO circuitry, including an internal write clock (WCK) 306. Further, when the memory device 210 receives the activate command 312, the memory device 210 enables the read clock distribution system and IO circuitry, including an internal read clock (RCK) 308. The memory controller 205 waits for a period of time, referred to as the RAS-CAS delay for write operations (tRCDWR) 322, to ensure that the memory device is now activated and ready to receive a write command.

After the RAS-CAS delay for write operations 322 expires, the memory controller 205 issues a command 302 in the form of a write command (WR CMD) 314. The memory controller 205 transmits the write command 314 to the memory device via the command/address pins 232. The memory device 210 receives the write command 314 and begins the process of executing the write command 314. In addition, when the memory device 210 receives the write command 314, the memory device 210 disables the read clock distribution system and IO circuitry, including the internal read clock 308, thereby reducing power consumption. After a period of time, referred to as the write latency (tWL) 324, the memory device 210 stores the write data 316 received via the data pins 234 to the DRAM core 270. As shown in FIG. 3A, the read clock distribution system and IO circuitry, including the internal read clock 308, are enabled during the RAS-CAS delay for write operations 322, even though no read operation is in progress.

As shown in FIG. 3B, when the memory controller 205 detects that a read memory access operation is in progress, the memory controller 205 issues a command 352 in the form of a power-down exit (PDX) command 360. The memory controller 205 transmits the power-down exit command 360 to the memory device via the command/address pins 232. The memory device 210 receives the power-down exit command 360 and begins the process of exiting the power-down state. The memory controller 205 waits for a period of time, referred to as the power-down exit time (tXP) 370, to ensure that the memory device is now powered up.

After the power-down exit time 370 expires, the memory controller 205 issues a command 352 in the form of an activate (ACT) command 362. The memory controller 205 transmits the activate command 362 to the memory device via the command/address pins 232. The memory device 210 receives the activate command 362 and begins the process of executing the activate command 362. In addition, when the memory device 210 receives the activate command 362, the memory device 210 enables the write clock distribution system and IO circuitry, including an internal write clock (WCK) 356. Further, when the memory device 210 receives the activate command 362, the memory device 210 enables the read clock distribution system and IO circuitry, including an internal read clock (RCK) 358. The memory controller 205 waits for a period of time, referred to as the RAS-CAS delay for read operations (tRCDRD) 372, to ensure that the memory device is now activated and ready to receive a read command.

After the RAS-CAS delay for read operations 372 expires, the memory controller 205 issues a command 352 in the form of a read command (RD CMD) 364. The memory controller 205 transmits the read command 364 to the memory device via the command/address pins 232. The memory device 210 receives the read command 364 and begins the process of executing the read command 364. In addition, when the memory device 210 receives the read command 364, the memory device 210 disables the write clock distribution system and IO circuitry, including the internal write clock 356, thereby reducing power consumption. After a period of time, referred to as the read latency (tRL) 374, the memory device 210 transmits the read data 366 read from the DRAM core 270 to the memory controller 205 via the data pins 234. As shown in FIG. 3B, the write clock distribution system and IO circuitry, including the internal write clock 356, are enabled during the RAS-CAS delay for read operations 372, even though no write operation is in progress.

Figure 4A:
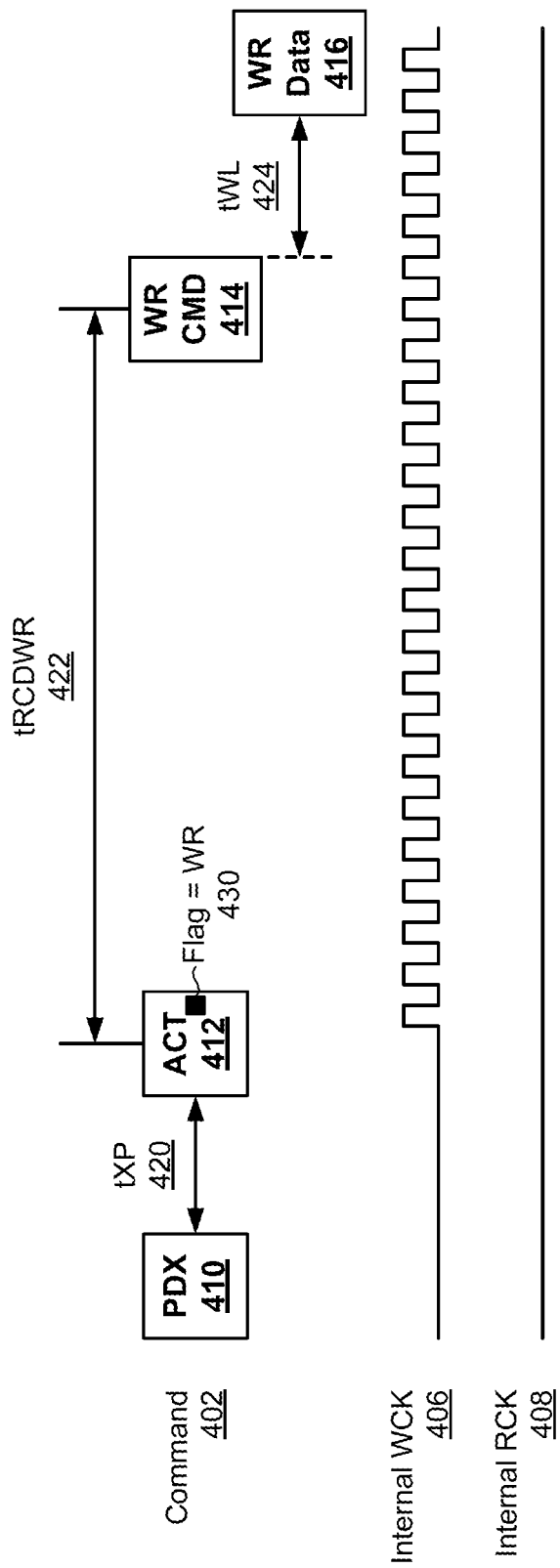
FIGS. 4A-4B set forth timing diagrams illustrating early identification of read operations and write operations during memory access operations of the computer system of FIG. 1, according to various embodiments.
Figure 4B:
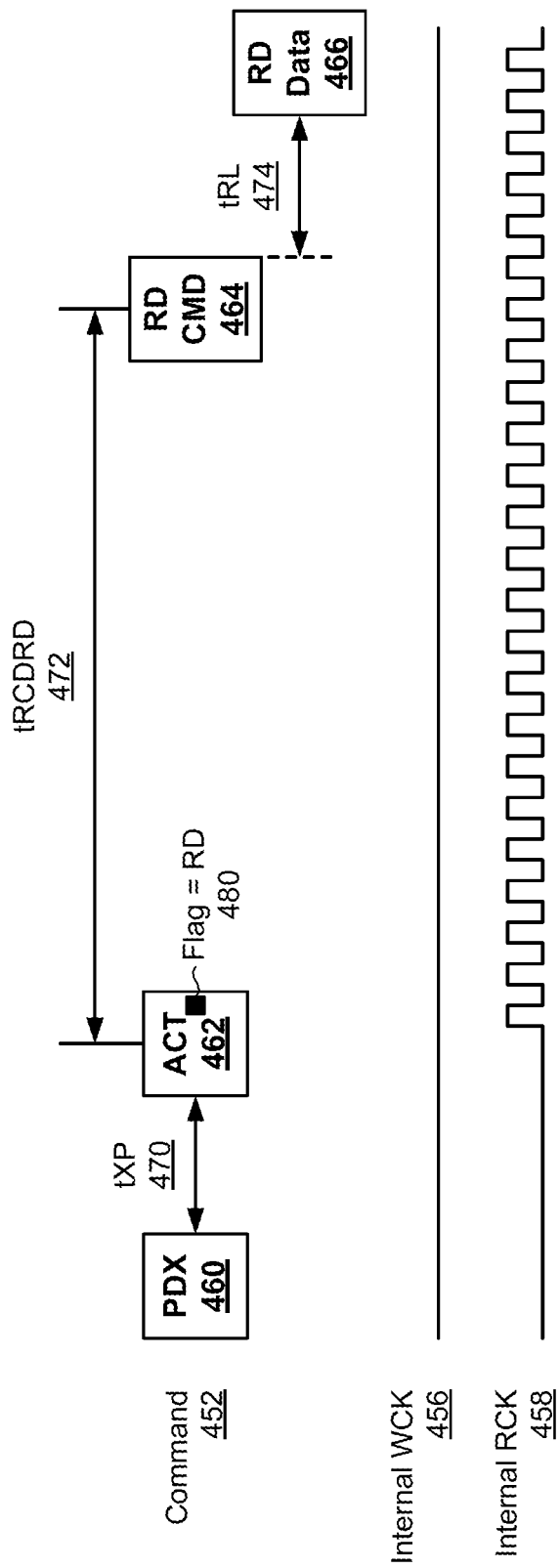

FIGS. 4A-4B set forth timing diagrams illustrating early identification of read operations and write operations during memory access operations of the computer system of FIG. 1, according to various embodiments.

As shown in FIG. 4A, when the memory controller 205 detects that a write memory access operation is in progress, the memory controller 205 issues a command 402 in the form of a power-down exit (PDX) command 410. The memory controller 205 transmits the power-down exit command 410 to the memory device via the command/address pins 232. The memory device 210 receives the power-down exit command 410 and begins the process of exiting the power-down state. The memory controller 205 waits for a period of time, referred to as the power-down exit time (tXP) 420, to ensure that the memory device is now powered up.

After the power-down exit time 420 expires, the memory controller 205 issues a command 302 in the form of an activate (ACT) command 312. The memory controller 205 transmits the activate command 412 to the memory device via the command/address pins 232. The memory device 210 receives the activate command 412 and begins the process of executing the activate command 412. The activate command 412 includes an indicator that indicates whether the memory access operation is a read operation or a write operation. As shown, the activate command 412 includes a flag=WR 430 indication. Therefore, when the memory device 210 receives the activate command 412, the memory device 210 enables the write clock distribution system and IO circuitry, including an internal write clock (WCK) 406. Further, when the memory device 210 receives the activate command 412, the memory device 210 disables the read clock distribution system and IO circuitry, including an internal read clock (RCK) 408, thereby reducing power consumption. The memory controller 205 waits for a period of time, referred to as the RAS-CAS delay for write operations (tRCDWR) 422, to ensure that the memory device is now activated and ready to receive a write command.

After the RAS-CAS delay for write operations 422 expires, the memory controller 205 issues a command 402 in the form of a write command (WR CMD) 414. The memory controller 205 transmits the write command 414 to the memory device via the command/address pins 232. The memory device 210 receives the write command 414 and begins the process of executing the write command 414. After a period of time, referred to as the write latency (tWL) 424, the memory device 210 stores the write data 416 received via the data pins 234 to the DRAM core 270. As shown in FIG. 4A, because the activate command includes a flag=WR indicator 430, the read clock distribution system and IO circuitry, including the internal read clock 408, are disabled during the RAS-CAS delay for write operations 422, thereby further reducing power consumption relative to the technique illustrated by the timing diagram included in FIG. 3A.

As shown in FIG. 4B, when the memory controller 205 detects that a read memory access operation is in progress, the memory controller 205 issues a command 452 in the form of a power-down exit (PDX) command 360. The memory controller 205 transmits the power-down exit command 460 to the memory device via the command/address pins 232. The memory device 210 receives the power-down exit command 460 and begins the process of exiting the power-down state. The memory controller 205 waits for a period of time, referred to as the power-down exit time (tXP) 470, to ensure that the memory device is now powered up.

After the power-down exit time 470 expires, the memory controller 205 issues a command 452 in the form of an activate (ACT) command 462. The memory controller 205 transmits the activate command 462 to the memory device via the command/address pins 232. The memory device 210 receives the activate command 462 and begins the process of executing the activate command 462. The activate command 462 includes an indicator that indicates whether the memory access operation is a read operation or a write operation. As shown, the activate command 462 includes a flag=RD 480 indication. Therefore, when the memory device 210 receives the activate command 462, the memory device 210 enables the read clock distribution system and IO circuitry, including an internal read clock (RCK) 458. Further, when the memory device 210 receives the activate command 462, the memory device 210 disables the write clock distribution system and IO circuitry, including an internal write clock (WCK) 456, thereby reducing power consumption. The memory controller 205 waits for a period of time, referred to as the RAS-CAS delay for read operations (tRCDRD) 472, to ensure that the memory device is now activated and ready to receive a read command.

After the RAS-CAS delay for read operations 472 expires, the memory controller 205 issues a command 452 in the form of a read command (RD CMD) 464. The memory controller 205 transmits the read command 464 to the memory device via the command/address pins 232. The memory device 210 receives the read command 464 and begins the process of executing the read command 464. In addition, when the memory device 210 receives the read command 464, the memory device 210 disables the write clock distribution system and IO circuitry, including the internal write clock 456, thereby reducing power consumption. After a period of time, referred to as the read latency (tRL) 474, the memory device 210 transmits the read data 466 read from the DRAM core 270 to the memory controller 205 via the data pins 234. As shown in FIG. 4B, because the activate command includes a flag=RD indicator 480, the write clock distribution system and IO circuitry, including the internal write clock 456, are disabled during the RAS-CAS delay for write operations 472, thereby further reducing power consumption relative to the technique illustrated by the timing diagram included in FIG. 3B.

As shown in FIGS. 4A-4B, the memory controller 205 provides a hint in the form of a read/write indicator included in the activate command, where the read/write indicator indicates whether the memory controller 205 is about to issue a read command or a write command at the end of the RAS-CAS delay time. The activate (ACT) command is illustrated in Table 1 below:

TABLE 1

Activate Command

| Command | WCK | CA0 | CA1 | CA2 |
|---------|-----|-----|-----|-----|
| ACT     | 0   | L   | CABI | RD/WR |
|         | 1   | R13 | R14 | R15 |
|         | 2   | BA2 | BA3 | R12 |
|         | 3   | BA0 | BA1 | R11 |
|         | 4   | R9  | CABI | R10 |
|         | 5   | R6  | R7  | R8 |
|         | 6   | R3  | R4  | R5 |
|         | 7   | R0  | R1  | R2 |

As shown, the memory controller 205 transmits the 24 bits of the activate command via three command/address pins CA0, CA1, and CA2 over eight write clock cycles WCK0 through WCK7. The activate command includes bits for row address (R15:0), bank address (BA3:0), and other information. In addition, the memory controller transmits the read/write (RD/WR) indicator via CA2 during WCK0. If the read/write (RD/WR) indicator indicates write accesses, then the DRAM device disables or applies power gates to the read clock distribution system, read I/O circuits, and/or other read-related circuitry. The DRAM device enables or removes the power gates from the write clock distribution, write I/O circuits, and/or other write-related circuitry. If the read/write (RD/WR) indicator indicates read accesses, then the DRAM device disables or applies power gates to the write clock distribution system, write I/O circuits, and/or other write-related circuitry. The DRAM device enables or removes the power gates from the read clock distribution, read I/O circuits, and/or other read-related circuitry.

In some examples, the activate command includes additional data in addition to a read/write indicator. The additional data can include, for example, which clock distribution systems, portions of IO circuitry, and/or circuitry to enable or disable for a subsequent read command or write command. This information can be at any technically feasible level of granularity. The information can be embedded in the activate command by adding additional write clock cycles to the activate command in addition to the eight write clock cycles shown in Table 1. For example, the activate command could be expanded to twelve write clock cycles, numbered 0 through 11. The read/write indicator could still be transmitted via CA2 during WCK0, as shown in Table 1. The additional data could be transmitted via CA0, CA1, and CA2 during write clock cycles 8, 9, 10, and 11. Additionally or alternatively, the additional data could be transmitted via one or more addition command/address pins in addition to CA0, CA1, and CA2.

It will be appreciated that the activate command described herein in conjunction with Table 1 is illustrative and that variations and modifications are possible. Among other things, the activate command can include fewer fields than shown in Table 1 and/or include additional fields not shown in Table 1. Further, the number of bits included in each field can be greater than or less than the number of bits shown in Table 1 for the various fields. Further, the order of the various bits in the activate command is not restricted to the order of bits shown in Table 1. In that regard, the read/write (RD/WR) indicator and optional additional data described herein can be included in the activate command in any technically feasible order. Further, the read/write (RD/WR) indicator and optional additional data described herein can be transmitted by the memory controller to the memory device in any technically feasible order. More generally, the command encoding, number of data rows, and number of bank bits of the activate command can vary in any technically feasible manner.

It will be appreciated that the techniques described herein are illustrative and that variations and modifications are possible. Among other things, the techniques are described in the context of exiting a power down (PDX) state. More generally, when the memory device 210 is in an idle state, the first activate command that enables the read/write circuitry and the clock distribution system is issued in a bank-idle state. The state prior to bank-idle state could be a power-down state, a self-refresh state (which is essentially a deeper form of a power-down state, the bank-idle state itself, and/or the like.

Figure 5:
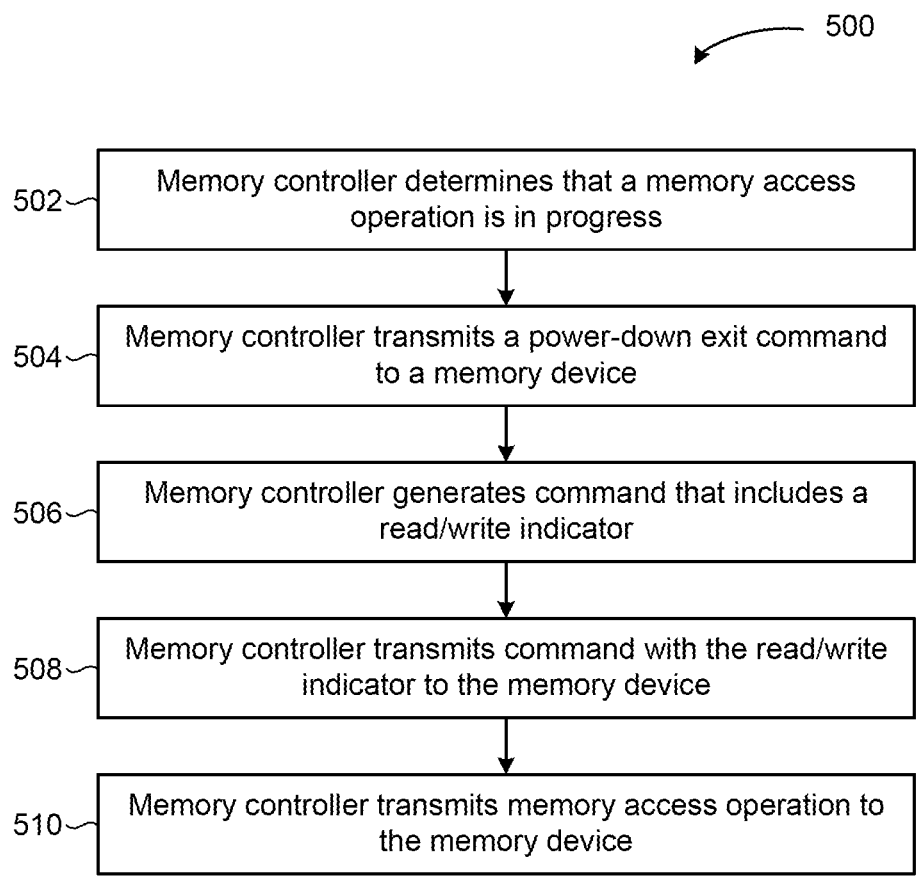
FIG. 5 is a flow diagram of method steps for performing a memory access by a memory controller of the computer system of FIG. 1, according to various embodiments.

FIG. 5 is a flow diagram of method steps for performing a memory access by a memory controller of the computer system of FIG. 1, according to various embodiments. Although the method steps are described in conjunction with the systems of FIGS. 1-4B, persons of ordinary skill in the art will understand that any system configured to perform the method steps, in any order, is within the scope of the present disclosure.

A method 500 begins at step 502, where a memory controller, such as the system memory controller 130 of FIG. 1, the parallel processing subsystem memory controller 132 of FIG. 1, the memory controller 205 of FIG. 2, and/or the like, determines that a memory access operation is in progress. In some examples, a CPU 102 and PPUs within parallel processing subsystem 112 access system memory 104 via the system memory controller 130. The system memory controller 130 transmits signals to the memory devices included in system memory 104 to initiate the memory devices, transmit commands to the memory devices, write data to the memory devices, read data from the memory devices, and/or the like. Similarly, in some examples, PPUs and/or other components within parallel processing subsystem 112 access PP memory 134 via the parallel processing subsystem memory controller 132. The parallel processing subsystem memory controller 132 transmits signals to the memory devices included in PP memory 134 to initiate the memory devices, transmit commands to the memory devices, write data to the memory devices, read data from the memory devices, and/or the like.

At step 504, the memory controller transmits a power-down exit command to a memory device, such as a memory device included in system memory 104, PP memory 134, and/or the like. The memory controller transmits the power-down exit command to the memory device by transmitting data to command/address pins of the memory device over one or more write clock cycles. To reduce power consumption, memory devices remain in a power-down state when not actively performing read operations, write operations, and/or other commands. To perform a memory access operation, the memory controller transmits a command to the memory device to exit this power-down state. The memory controller waits for a period of time, referred to as the power-down exit time, to ensure that the memory device is now powered up.

At step 506, the memory controller generates a command that includes a read/write indicator. The read/write indicator can be included in an activate command that initiates a memory access operation. Additionally or alternatively, the read/write indicator can be included in a power command that identifies circuits within the memory device to enable or disable for power consumption management. Additionally or alternatively, the read/write indicator can be included in any technically feasible command transmitted by the memory controller to the memory device. The read/write indicator can be a single flag or bit that indicates whether the memory controller is about to issue a read command or a write command.

Additionally or alternatively, the read/write indicator could be a multi-bit code that indicates whether the memory controller is about to issue only read commands, only write commands, or a combination of read commands and write commands. Further, the command can include additional data in addition to a read/write indicator. The additional data can include, for example, which clock distribution systems, portions of IO circuitry, and/or circuitry to enable or disable for a subsequent read command or write command. This information can be at any technically feasible level of granularity. The memory device accesses the read/write indicator, and optional additional data, to determine which clock distribution systems, I/O circuitry, and/or other related circuitry to enable and disable.

At step 508, the memory controller transmits the command to the memory device. The memory controller transmits the command to the memory device by transmitting data to command/address pins of the memory device over one or more write clock cycles. The memory controller waits for a period of time, referred to as the RAS-CAS delay time, to ensure that the memory device is ready to perform the memory access operation.

At step 510, the memory controller transmits the memory access operation to the memory device. If the memory access operation is a read operation, then the memory controller transmits a read command to the memory device. The memory device retrieves the requested read data and transmits the data to the memory controller. If the memory access operation is a write operation, then the memory controller transmits a write command to the memory device. The memory controller also transmits write data to the memory device. The memory device stores the received write data in the memory device.

The method 500 then terminates. Alternatively, the method 500 proceeds to step 502 for the memory controller to perform additional memory access operations.

Figure 6:
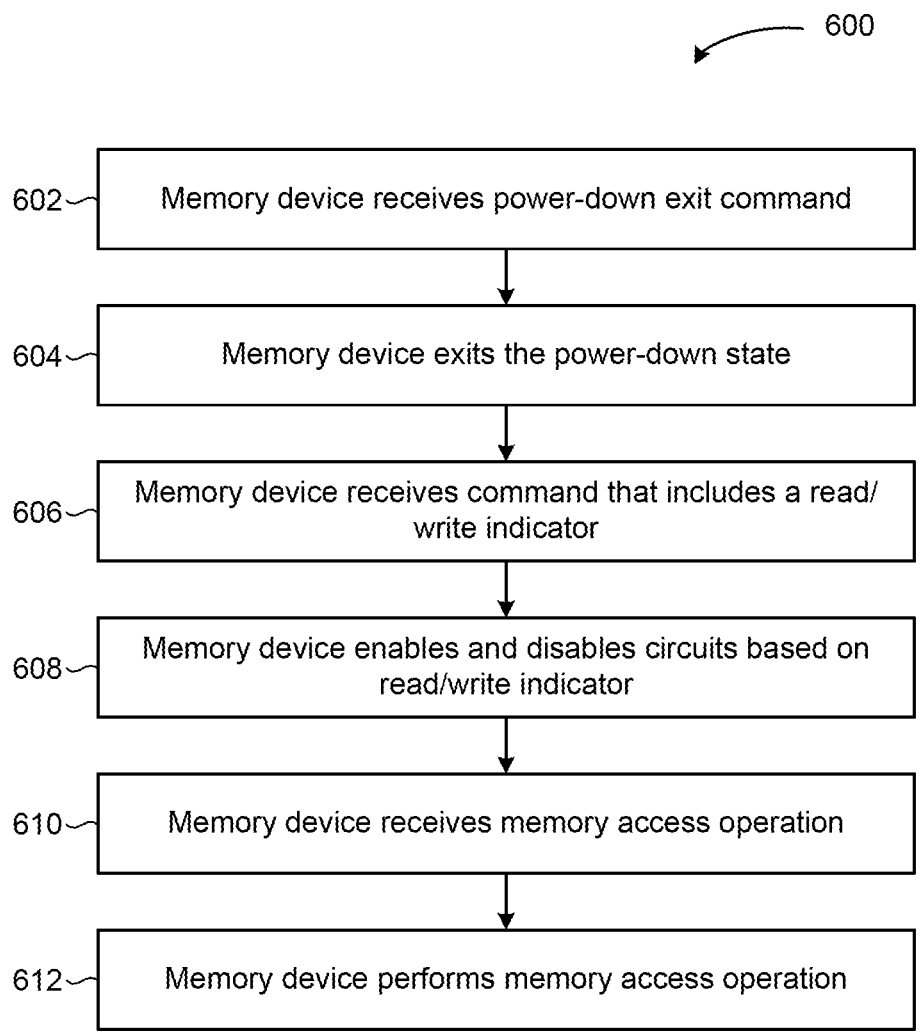
FIG. 6 is a flow diagram of method steps for performing a memory access on a memory device included in system memory and/or parallel processing memory of the computer system of FIG. 1, according to various embodiments.

FIG. 6 is a flow diagram of method steps for performing a memory access on a memory device included in system memory and/or parallel processing memory of the computer system of FIG. 1, according to various embodiments. Although the method steps are described in conjunction with the systems of FIGS. 1-4B, persons of ordinary skill in the art will understand that any system configured to perform the method steps, in any order, is within the scope of the present disclosure.

A method 600 begins at step 602, where a memory device, such as a memory device included in the system memory 104 of FIG. 1, as a memory device included in the PP memory 134 of FIG. 1, the memory device 210 of FIG. 2, and/or the like, receives a power-down exit command. The memory device receives the power-down exit command from a memory controller, such as the system memory controller 130 of FIG. 1, the parallel processing subsystem memory controller 132 of FIG. 1, the memory controller 205 of FIG. 2, and/or the like. The memory device receives the power-down exit command from the memory controller via command/address pins of the memory device over one or more write clock cycles.

At step 604, the memory device exits the power-down state. To reduce power consumption, memory devices remain in a power-down state when not actively performing read operations, write operations, and/or other commands. To perform a memory access operation, the memory device exits this power-down state. After a period of time, referred to as the power-down exit time, the memory device is powered up.

At step 606, the memory device receives a command from the memory controller that includes a read/write indicator. The read/write indicator can be included in an activate command that initiates a memory access operation. Additionally or alternatively, the read/write indicator can be included in a power command that identifies circuits within the memory device to enable or disable for power consumption management. Additionally or alternatively, the read/write indicator can be included in any technically feasible command transmitted by the memory controller to the memory device. The read/write indicator can be a single flag or bit that indicates whether the memory controller is about to issue a read command or a write command.

Additionally or alternatively, the read/write indicator could be a multi-bit code that indicates whether the memory controller is about to issue only read commands, only write commands, or a combination of read commands and write commands. Further, the command can include additional data in addition to a read/write indicator. The additional data can include, for example, which clock distribution systems, portions of IO circuitry, and/or circuitry to enable or disable for a subsequent read command or write command. This information can be at any technically feasible level of granularity.

At step 608, the memory device enables and disables circuits based on the read/write indicator. If the read/write indicator indicates that memory controller is about to generate read commands, and not generate write commands, then the memory device enables the read clock distribution system, read I/O circuits, and/or other read related circuitry but disables the write clock distribution system, write I/O circuits, and/or other write related circuitry. If the read/write indicator indicates that memory controller is about to generate write commands, but not generate read commands, then the memory device enables the write clock distribution system, write I/O circuits, and/or other write related circuitry but disables the read clock distribution system, read I/O circuits, and/or other read related circuitry. If the read/write indicator indicates that memory controller is about to generate a combination of read commands and write commands, then the memory device enables both the read clock distribution system and the write clock distribution system. Likewise, the memory device enables both the read and write I/O circuits, and/or other read related circuitry and write related circuitry.

After a period of time, referred to as the RAS-CAS delay time, the memory device is ready to perform the memory access operation. Further, the memory device has enabled clock distribution systems, I/O circuits, and/or other related circuitry to support the memory access operation. The memory device has disabled clock distribution systems, I/O circuits, and/or other related circuitry that are not needed to support the memory access operation.

At step 610, the memory device receives the memory access operation from the memory controller. If the memory access operation is a read operation, then the memory device receives a read command from the memory controller. The memory device retrieves the requested read data and transmits the data to the memory controller. If the memory access operation is a write operation, then the memory device receives a write command from the memory controller. The memory controller also transmits write data to the memory device. The memory device stores the received write data in the memory device.

At step 612, the memory device performs the memory access operation. If the memory access operation is a read operation, then the memory device retrieves the requested read data and transmits the data to the memory controller. If the memory access operation is a write operation, then the memory device stores the write data received from the memory controller in the memory device.

The method 600 then terminates. Alternatively, the method 600 proceeds to step 602 for the memory device to perform additional memory access operations.

In sum, various embodiments are directed to techniques for efficiently performing memory access operations in a memory device. With the disclosed techniques, a memory controller includes an indicator with the activate command that identifies whether the upcoming memory access operation is a read operation or a write operation. When the memory controller determines that a memory access operation is in progress, the memory controller transmits a power-down exit command to the memory device. After the expiration of the power-down exit time, the memory controller transmits an activate command to the memory device. The activate command includes a read/write indicator that identifies the memory access command as either a read operation or a write operation.

In response to receiving the activate command, the memory device accesses the read/write indicator. If the read/write indicator identifies the memory access command as a read operation, then the memory device enables only the read clock distribution system and IO circuitry and leaves the write clock distribution system and IO circuitry in a disabled state. After the expiration of the activate time, the read clock distribution system and IO circuitry are now enabled. The memory controller transmits the read command to the memory device. After the read latency expires, the memory device performs the read operation. If the read/write indicator identifies the memory access command as a write operation, then the memory device enables only the write clock distribution system and IO circuitry and leaves the read clock distribution system and IO circuitry in a disabled state. After the expiration of the activate time, the write clock distribution system and IO circuitry are now enabled. The memory controller transmits the write command to the memory device. After the write latency expires, the memory device performs the write operation.

At least one technical advantage of the disclosed techniques relative to the prior art is that, with the disclosed techniques, the clock distribution system and IO circuitry are enabled earlier during a memory access operation. In addition, the memory device receives an early indication of whether the upcoming memory access operation is a read operation or a write operation. If the early indication identifies the upcoming memory access operation as a read operation, then the memory device enables only the read clock distribution system and IO circuitry and leaves the write clock distribution system and IO circuitry in a disabled state. Likewise, if the early indication identifies the upcoming memory access operation as a write operation, then the memory device enables only the write clock distribution system and IO circuitry and leaves the read clock distribution system and IO circuitry in a disabled state. As a result, only the needed clock distribution system and IO circuitry are enabled, thereby reducing power consumption relative to approaches that enable both the read clock distribution system and IO circuitry and the write clock distribution system and IO circuitry. These advantages represent one or more technological improvements over prior art approaches.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for performing a memory access operation on a memory device, the method comprising:
   prior to receiving the memory access operation, receiving an indicator that identifies the memory access operation as including at least one of a read operation or a write operation;
   enabling a first circuit based on the indicator; and
   maintaining a disabled state of a second circuit based on the indicator.

2. The computer-implemented method of claim 1, wherein:
   the indicator identifies the memory access operation as including a read operation,
   the first circuit includes at least one of a read clock distribution system, a read input/output circuit, or other read related circuitry, and
   the second circuit includes at least one of a write clock distribution system, a write input/output circuit, or other write related circuitry.

3. The computer-implemented method of claim 1, wherein:
   the indicator identifies the memory access operation as including a write operation,
   the first circuit includes at least one of a write clock distribution system, a write input/output circuit, or other write related circuitry, and
   the second circuit includes at least one of a read clock distribution system, a read input/output circuit, or other read related circuitry.

4. The computer-implemented method of claim 1, wherein:
   the indicator identifies the memory access operation as included in a plurality of memory access operations including a read operation and a write operation,
   the first circuit includes at least one of a read clock distribution system, a read input/output circuit, or other read related circuitry, and
   the first circuit further includes at least one of a write clock distribution system, a write input/output circuit, or other write related circuitry.

5. The computer-implemented method of claim 1, wherein the indicator is included in an activate command that initiates the memory access operation.

6. The computer-implemented method of claim 1, wherein the indicator is included in a power command that identifies circuits within the memory device to enable or disable for power consumption management.

7. The computer-implemented method of claim 1, further comprising, prior to receiving the memory access operation, receiving data that identifies at least one of a first clock distribution system or a first input/output circuit included in the first circuit.

8. The computer-implemented method of claim 7, wherein the data further identifies at least one of a second clock distribution system or a second input/output circuit included in the second circuit.

9. The computer-implemented method of claim 1, further comprising:
   prior to receive the indicator, receiving a command to exit a power-down state; and
   in response, exiting the power-down state.

10. The computer-implemented method of claim 1, further comprising:
    receiving a configuration command; and
    configuring the memory device to utilize the indicator or ignore the indicator based on the configuration command.

11. A system, comprising:
    a memory controller; and
    a memory device coupled to the memory controller, and that:
       prior to receiving a memory access operation, receives an indicator that identifies the memory access operation as including at least one of a read operation or a write operation;
       enables a first circuit based on the indicator; and
       maintains disabled state of a second circuit based on the indicator.

12. The system of claim 11, wherein:
    the indicator identifies the memory access operation as including a read operation,
    the first circuit includes at least one of a read clock distribution system, a read input/output circuit, or other read related circuitry, and
    the second circuit includes at least one of a write clock distribution system, a write input/output circuit, or other write related circuitry.

13. The system of claim 11, wherein:
    the indicator identifies the memory access operation as including a write operation,
    the first circuit includes at least one of a write clock distribution system, a write input/output circuit, or other write related circuitry, and
    the second circuit includes at least one of a read clock distribution system, a read input/output circuit, or other read related circuitry.

14. The system of claim 11, wherein:
    the indicator identifies the memory access operation as included in a plurality of memory access operations including a read operation and a write operation,
    the first circuit includes at least one of a read clock distribution system, a read input/output circuit, or other read related circuitry, and
    the first circuit further includes at least one of a write clock distribution system, a write input/output circuit, or other write related circuitry.

15. The system of claim 11, wherein the indicator is included in an activate command that initiates the memory access operation.

16. The system of claim 11, wherein the indicator is included in a power command that identifies circuits within the memory device to enable or disable for power consumption management.

17. The system of claim 11, wherein the memory device further, prior to receiving the memory access operation, receives data that identifies at least one of a first clock distribution system or a first input/output circuit included in the first circuit.

18. The system of claim 17, wherein the data further identifies at least one of a second clock distribution system or a second input/output circuit included in the second circuit.

19. The system of claim 11, wherein the memory device further:
    prior to receive the indicator, receives a command to exit a power-down state; and
    in response, exits the power-down state.

20. The system of claim 11, wherein the memory device further:
   receives a configuration command; and
   configures the memory device to utilize the indicator or ignore the indicator based on the configuration command.

* * * * *